(12) United States Patent
Kwon et al.

(10) Patent No.: US 10,707,438 B2
(45) Date of Patent: Jul. 7, 2020

(54) LIGHT EMITTING DISPLAY DEVICE

(71) Applicant: LG DISPLAY CO., LTD., Seoul (KR)

(72) Inventors: Hoiyong Kwon, Osan-si (KR); SeYeoul Kwon, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/226,404

(22) Filed: Dec. 19, 2018

(65) Prior Publication Data
US 2019/0207150 A1 Jul. 4, 2019

(30) Foreign Application Priority Data
Dec. 29, 2017 (KR) .......................... 10-2017-0184850

(51) Int. Cl.
*H01L 27/14* (2006.01)
*H01L 29/04* (2006.01)
(Continued)

(52) U.S. Cl.
CPC ...... *H01L 51/5228* (2013.01); *H01L 27/3246* (2013.01); *H01L 27/3248* (2013.01);
(Continued)

(58) Field of Classification Search
CPC ............. H01L 27/3246; H01L 27/3262; H01L 51/5206; H01L 2251/301; H01L 27/322;
(Continued)

(56) References Cited

U.S. PATENT DOCUMENTS

2004/0108810 A1 6/2004 Tsuimura et al.
2007/0164939 A1* 7/2007 Miyazaki .................. G09G 3/20
345/76
(Continued)

FOREIGN PATENT DOCUMENTS

JP 2008277161 A 11/2008
JP 2009010258 A 1/2009
(Continued)

OTHER PUBLICATIONS

Office Action dated Apr. 13, 2019 issued in the corresponding Korean Patent Application No. 10-2017-0184850 (5 pages) and English translation (5 pages).

*Primary Examiner* — Meiya Li
(74) *Attorney, Agent, or Firm* — Polsinelli PC (57) ABSTRACT

A light emitting display device includes a substrate including a plurality of sub pixel areas having an emission area and an anode contact area, a driving thin film transistor disposed in each of the plurality of sub pixel areas, a planarization layer disposed on the substrate, a cathode electrode disposed on the planarization layer overlapped with the emission area, a plurality of connection electrode patterns disposed on the planarization layer overlapped with the anode contact area, and connected with respective source electrodes of the driving thin film transistors disposed in the plurality of sub pixel areas by one-to-one correspondence, an emission layer disposed on the cathode electrode, and a plurality of anode electrodes disposed on the emission layer, and connected with the plurality of connection electrode patterns through the anode contact area by one-to-one correspondence.

25 Claims, 3 Drawing Sheets

(51) Int. Cl.
*H01L 31/036* (2006.01)
*H01L 51/52* (2006.01)
*H01L 27/32* (2006.01)

(52) U.S. Cl.
CPC ...... *H01L 27/3258* (2013.01); *H01L 27/3262* (2013.01); *H01L 27/3272* (2013.01); *H01L 27/3276* (2013.01); *H01L 51/5206* (2013.01); *H01L 27/322* (2013.01); *H01L 27/3279* (2013.01); *H01L 2251/301* (2013.01)

(58) Field of Classification Search
CPC ............. H01L 27/3248; H01L 27/3258; H01L 27/3272; H01L 27/3276; H01L 27/3279; H01L 51/5228; H01L 27/3211; H01L 51/5221; H01L 51/5246; H01L 51/5281
See application file for complete search history.

(56) References Cited

U.S. PATENT DOCUMENTS

| | | | |
|---|---|---|---|
| 2014/0353607 A1 | 12/2014 | Kim | |
| 2016/0104760 A1* | 4/2016 | Maeda | H01L 27/3279 257/40 |
| 2018/0301521 A1* | 10/2018 | Yang | H01L 27/3246 |

FOREIGN PATENT DOCUMENTS

| | | |
|---|---|---|
| KR | 19990078420 A | 10/1999 |
| KR | 100705819 B1 | 4/2007 |
| KR | 20150075016 A | 7/2015 |

* cited by examiner

LIGHT EMITTING DISPLAY DEVICE

CROSS REFERENCE TO RELATED APPLICATION

This application claims the benefit of the Korean Patent Application No. 10-2017-0184850 filed on Dec. 29, 2017, which is hereby incorporated by reference in its entirety as if fully set forth herein.

BACKGROUND

Field of the Disclosure

The present disclosure relates to a light emitting display device.

Description of the Background

A light emitting display device is a self light emitting display device, which has advantages of low power consumption, rapid response speed, high emission efficiency, great luminance, and wide viewing angle. The light emitting display device is mounted on electronic devices or home appliances such as television, monitor, notebook computer, smart phone, tablet computer, electronic pad, wearable devices, watch phone, mobile information device, navigation, and vehicle control display device, and are attracting much attention as a next-generation display device for displaying an image.

The light emitting display device may use a flexible substrate of a plastic material as a base substrate. Thus, various studies and developments for realizing a flexible display device or stretchable display device by the use of light emitting display device are recently underway.

The light emitting display device may display an image by a top emission type or a bottom emission type.

The related art top emission type light emitting display device may include a pixel circuit having a driving thin film transistor arranged in a sub pixel area, an anode electrode connected with the driving thin film transistor, an emission layer disposed on the anode electrode, and a cathode electrode disposed on the emission layer. In this case, the anode electrode is formed of a reflective metal material, and the cathode electrode is formed of a transparent conductive metal material for improving transmittance.

However, in case of the related art top emission type light emitting display device, luminance uniformity may be degraded due to a voltage drop (IR Drop) of a cathode voltage caused by a high resistance in the cathode electrode formed of the transparent conductive metal material.

SUMMARY

The present disclosure has been made in view of the above problems, and it is an object of the present disclosure to provide a light emitting display device capable of realizing a uniform luminance.

In accordance with an aspect of the present disclosure, the above and other objects can be accomplished by the provision of a light emitting display device comprising a substrate including a plurality of sub pixel areas having an emission area and an anode contact area adjacent to the emission area, a driving thin film transistor disposed in each of the plurality of sub pixel areas, a planarization layer disposed on the substrate and configured to cover the driving thin film transistor disposed in each of the plurality of sub pixel areas, a cathode electrode disposed on the planarization layer overlapped with the emission area in each of the plurality of sub pixel areas, a plurality of connection electrode patterns disposed on the planarization layer overlapped with the anode contact area in each of the plurality of sub pixel areas, and connected with respective source electrodes of the driving thin film transistors disposed in the plurality of sub pixel areas by one-to-one correspondence, an emission layer disposed on the cathode electrode, and a plurality of anode electrodes disposed on the emission layer in each of the plurality of sub pixel areas, and connected with the plurality of connection electrode patterns through the anode contact area by one-to-one correspondence.

BRIEF DESCRIPTION OF THE DRAWINGS

The accompanying drawings, which are included to provide a further understanding of aspects of the application and are incorporated in and constitute a part of this application, illustrate aspect(s) of the application and together with the description serve to explain the principle of aspects of the application.

In the drawings.

DETAILED DESCRIPTION

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, aspects of a light emitting display device according to the present disclosure will be described in detail with reference to the accompanying drawings. In adding reference numerals to elements of each of the drawings, although the same elements are illustrated in other drawings, like reference numerals may refer to like elements. In the following description, when the detailed description of the relevant known function or configuration is determined to unnecessarily obscure the important point of the present disclosure, the detailed description will be omitted.

Figure 1:
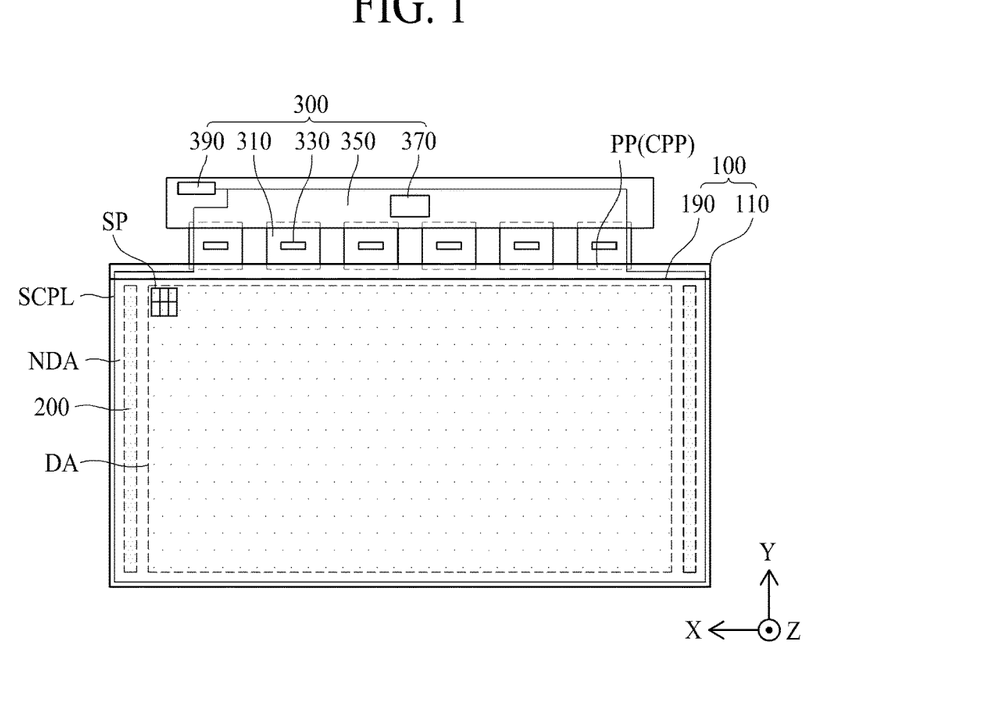
FIG. 1 is a plane view illustrating a light emitting display device according to one aspect of the present disclosure.
Figure 2:
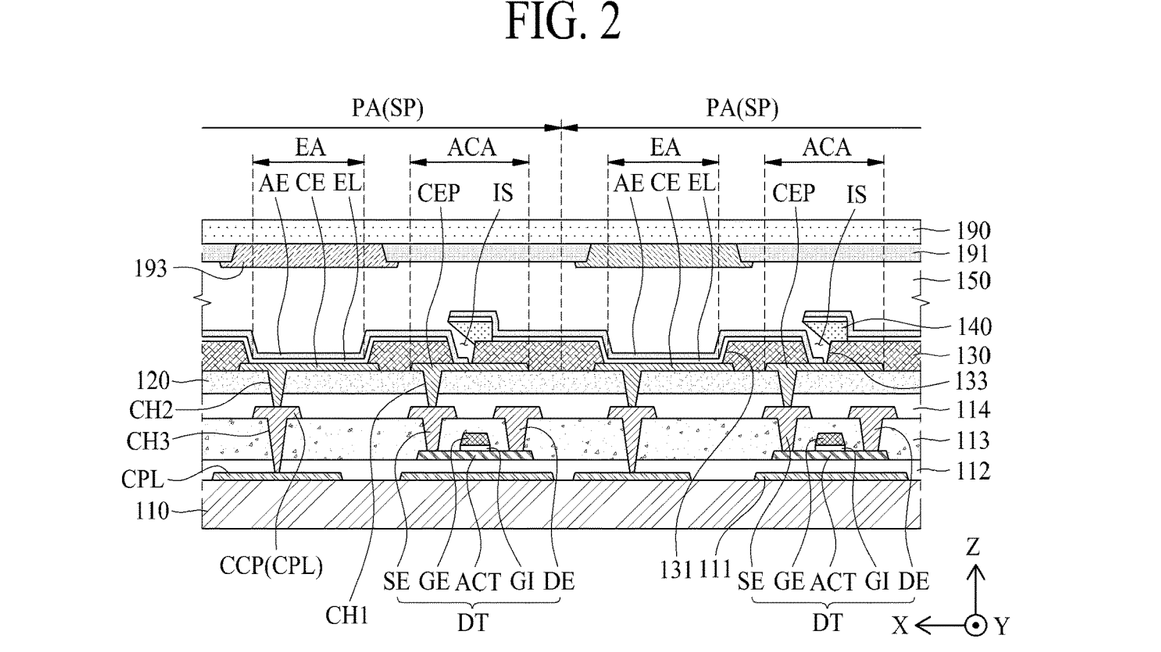
FIG. 2 is a cross-sectional view illustrating adjacent two of sub pixels shown in FIG. 1.
Figure 3:
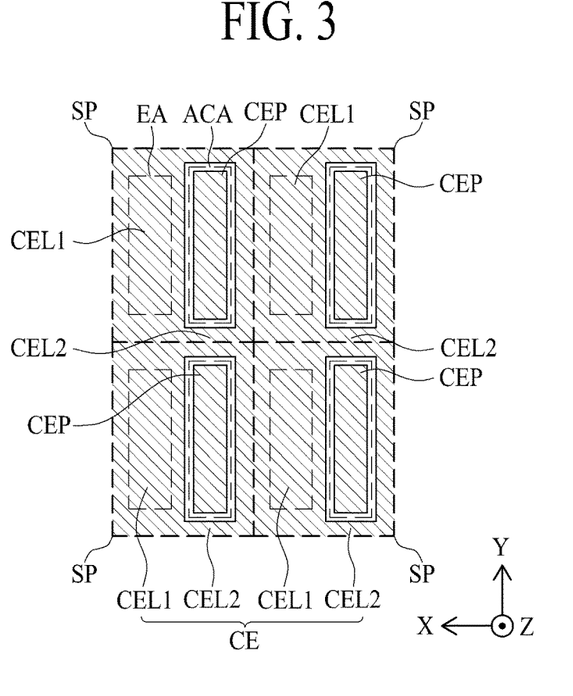
FIG. 3 is a plane view illustrating a cathode electrode and a connection electrode pattern shown in FIG. 2.
Figure 4:
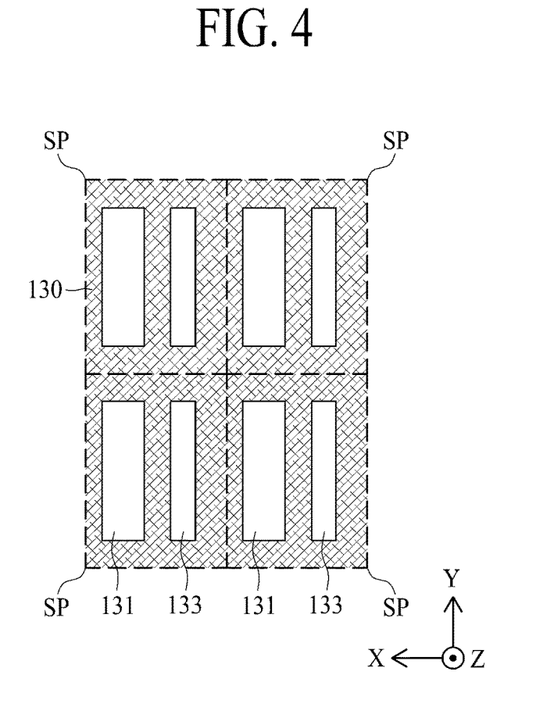
FIG. 4 is a plane view illustrating a bank layer shown in FIG. 2.

FIG. 1 is a plane view illustrating a light emitting display device according to one aspect of the present disclosure. FIG. 2 is a cross-sectional view illustrating adjacent two of sub pixels shown in FIG. 1. FIG. 3 is a plane view illustrating a cathode electrode and a connection electrode pattern shown in FIG. 2. FIG. 4 is a plane view illustrating a bank layer shown in FIG. 2.

Referring to FIGS. 1 to 4, the light emitting display device according to one aspect of the present disclosure may include a display panel 100 and a panel driving circuit portion 300.

The display panel 100 may include a substrate 110 and an encapsulation substrate 190 facing each other. The substrate 110 may be a thin film transistor array substrate or a flexible substrate. The encapsulation substrate 190 may be a color filter array substrate including a color filter. The substrate 110 is relatively larger than the encapsulation substrate 190, whereby one edge of the substrate 110 may be exposed to the external without being covered by the encapsulation substrate 190.

The display panel 100 may include a display area DA and a non-display area NDA surrounding the display area DA.

The display area DA includes gate lines, data lines, and driving power lines, wherein sub pixels SP for displaying an image are arranged in sub pixel areas defined by the gate lines and the data lines.

Among the plurality of sub pixels SP, at least adjacent three sub pixels SP arranged along a length direction of the gate line constitute one unit pixel. Herein, one unit pixel may include red, green, and blue sub pixels, but not limited to this structure. For example, one unit pixel may further include a white sub pixel in addition to the red, green, and blue sub pixels.

In detail, the display panel 100 according to one aspect of the present disclosure may include a substrate 110, a buffer layer 112, a driving thin film transistor DT, a planarization layer 120, a cathode electrode CE, a plurality of connection electrode patterns CEP, an emission layer EL, and a plurality of anode electrodes AE.

The substrate 110 may be a flexible substrate or a plastic film. For example, the substrate 110 may be a transparent polyimide film. The substrate 110 may include a plurality of sub pixel areas PA, wherein each sub pixel area PA includes an emission area EA, and an anode contact area ACA adjacent to the emission area EA.

The buffer layer 112 is disposed on the substrate 110. The buffer layer 112 prevents moisture from being permeated into the emission layer EL through the substrate 110 which is vulnerable to moisture permeation. Also, the buffer layer 112 prevents foreign matters such as metal ions from being diffused from the substrate 110 and being permeated into the driving thin film transistor DT. For example, the buffer layer 112 may be formed in a multi-layered structure obtained by alternately depositing at least one inorganic film among a silicon oxide film (SiOx), a silicon nitride film (SiNx), and a silicon oxide nitride film (SiON). It is possible to omit the buffer film 112.

The driving thin film transistor DT is disposed on the buffer layer 112 in each of the plurality of sub pixel areas PA. The driving thin film transistor DT according to one aspect of the present disclosure may include an active layer ACT, a gate insulating film GI, a gate electrode GE, an insulating interlayer 113, a source electrode SE, and a drain electrode DE.

The active layer ACT is disposed on the buffer layer 112. The active layer ACT may include a channel region overlapped with the gate electrode GE, and source and drain regions which are parallel to each other with the channel region positioned in-between. The active layer ACT may include an oxide semiconductor material such as zinc oxide (ZnO), indium zinc oxide (InZnO), or indium gallium zinc oxide (InGaZnO4), but not limited to these materials. For example, the active layer ACT may include single crystal silicon, polycrystalline silicon, or organic material in addition to the oxide semiconductor material.

The gate insulating film GI is prepared on the active layer ACT. The gate insulating film GI insulates the active layer ACT and the gate electrode GE from each other. For example, the gate insulating film GI may be formed in a single-layered structure of a silicon oxide film (SiOx), a silicon nitride film (SiNx), or a silicon oxide nitride film (SiON), or a multi-layered structure including at least two among the silicon oxide film (SiOx), the silicon nitride film (SiNx), and the silicon oxide nitride film (SiON), but not limited to these structures.

The gate electrode GE is prepared on the gate insulating film GI. The gate electrode GE is overlapped with the channel region of the active layer ACT under the circumstances the gate insulating film GI is interposed in-between. For example, the gate electrode GE may be formed in a single-layered structure or multi-layered structure selected among molybdenum (Mo), aluminum (Al), chrome (Cr), gold (Au), titanium (Ti), nickel (Ni), neodymium (Nd), copper (Cu), and theirs alloys, but not limited to these structures. The gate electrode GE may be manufactured together with the gate lines provided on the display area DA, and may be formed of the same material as that of the gate lines provided on the display area DA.

The insulating interlayer 113 is disposed on the substrate 110, and is configured to cover the gate electrode GE and the active layer ACT. The insulating interlayer 113 insulates the gate electrode GE from the source electrode SE and the drain electrode DE. For example, the insulating interlayer 113 may be formed of an insulating material such as silicon oxide (SiOx), silicon nitride (SiNx), photo acryl, or benzocyclobutene (BCB).

The drain electrode DE is disposed on the insulating interlayer 113 which is overlapped with the drain region of the active layer ACT, and the drain electrode DE is electrically connected with the drain region of the active layer ACT via a drain contact hole prepared in the insulating interlayer 113.

The source electrode SE is disposed on the insulating interlayer 113 which is overlapped with the source region of the active layer ACT, and the source electrode SE is electrically connected with the source region of the active layer ACT via a source contact hole prepared in the insulating interlayer 113.

The drain electrode DE and the source electrode SE may be manufactured together with the data lines provided on the display area DA, and may be formed of the same material as that of the data lines provided on the display area DA. The drain electrode DE and the source electrode SE according to one aspect of the present disclosure may be formed of molybdenum (Mo), aluminum (Al), chrome (Cr), gold (Au), titanium (Ti), nickel (Ni), neodymium (Nd), copper (Cu), or theirs alloys, wherein the at least one drain electrode DE and the source electrode may be formed in a single-layered structure of any one material selected from the aforementioned metal materials and alloys, or a multi-layered structure of at least two selected from the aforementioned metal materials and alloys.

Additionally, the display panel 100 according to one aspect of the present disclosure may further include at least one switching transistor and storage capacitor, disposed in each of the plurality of sub pixel areas PA, together with the driving thin film transistor DT. The at least one switching transistor supplies a data signal, which is supplied to the data line, to the gate electrode GE of the driving thin film transistor DT, or respectively supplies a voltage for initializing the storage capacitor and a voltage used to sample a threshold voltage of the driving thin film transistor DT and to store the sampled voltage in the storage capacitor to the source electrode SE and the gate electrode GE of the driving thin film transistor DT. The storage capacitor may be prepared in an overlap area between the source electrode SE and the gate electrode GE of the driving thin film transistor DT.

The planarization layer 120 covers the driving thin film transistor DT disposed in each of the plurality of sub pixel areas PA. The planarization layer 120 may provide a planarization surface to an upper surface of the substrate 110 provided with the driving thin film transistor DT. The planarization layer 120 according to one aspect of the present disclosure may be formed of acryl resin, epoxy resin, phenolic resin, polyamide resin, or polyimide resin, but not limited to these materials.

The cathode electrode CE may be disposed on the planarization layer 120 which is overlapped with the emission area EA in each of the plurality of sub pixel areas PA. The cathode electrode CE may be disposed on the remaining portions of the planarization layer 120 except the anode contact area ACA for each of the plurality of sub pixel areas PA in an entire area of the planarization layer 120. Accordingly, the anode contact area ACA in each of the plurality of sub pixel areas PA is surrounded by the cathode electrode CE, and is provided as an island shape in each of the plurality of sub pixel areas PA. The cathode electrode CE may be supplied with cathode power from the pane driving circuit portion 300 through a pad portion disposed at one edge of the substrate 110.

The cathode electrode CE according to one aspect of the present disclosure may include a metal material having a low work function and a high reflection efficiency. For example, the cathode electrode CE may be formed in a multi-layered structure, for example, a deposition structure (Ti/Al/Ti) of aluminum (Al) and titanium (Ti), a deposition structure (ITO/Al/ITO) of aluminum (Al) and ITO, APC alloy (Ag/Pd/Cu), and a deposition structure (ITO/APC/ITO) of APC alloy and ITO, or may be formed in a single-layered structure or a multi-layered structure of one of silver (Ag), aluminum (Al), molybdenum (Mo), gold (Au), magnesium (Mg), calcium (Ca), barium (Ba), and metal nano wire. Herein, when the light emitting display device according to the present disclosure is embodied in a stretchable display device, the cathode electrode CE may be formed of a metal nano wire.

The cathode electrode CE according to one aspect of the present disclosure may include a plurality of cathode electrode lines CEL1, and a plurality of cathode electrode connection lines CEL2.

Each of the plurality of cathode electrode lines CEL1 is disposed on each emission area EA in each of the plurality of sub pixel areas PA. The plurality of cathode electrode lines CEL1 may extend in a second direction Y which is perpendicular to a first direction X, wherein the plurality of cathode electrode lines CEL1 are provided at fixed intervals along the first direction X. For example, each of the plurality of cathode electrode lines CEL1 may be disposed while being parallel to each other under the circumstances that the plurality of connection electrode patterns CEP provided along the second direction Y are interposed in-between. Herein, the first direction X may be defined as a direction which is parallel to a length direction of the gate line, and the second direction Y may be defined as a direction which is parallel to a length direction of the data line.

Each of the plurality of cathode electrode connection lines CEL2 is disposed between each of the plurality of connection electrode patterns CEP arranged along the second direction Y, and each of the plurality of cathode electrode connection lines CEL2 electrically connects the two cathode electrode lines CEL1, which are adjacent to each other along the first direction X, with each other. Accordingly, the plurality of cathode electrode lines CEL1 which are provided at fixed intervals along the first direction X are electrically connected with each other by the plurality of cathode electrode connection lines CEL2, whereby the cathode electrode CE may be disposed in a mesh configuration on the substrate 110. That is, the cathode electrode CE may be formed as one body or un-separated single electrode layer in the remaining portions except the anode contact area ACA in each of the plurality of sub pixel areas PA.

Each of the plurality of connection electrode patterns CEP is disposed on the planarization layer 120 overlapped with the anode contact area ACA in each of the plurality of sub pixel areas PA, and is connected with the source electrode SE of the driving thin film transistor DT disposed in each of the plurality of sub pixel areas PA by one-to-one correspondence. Each of the plurality of connection electrode patterns CEP is electrically separated from the cathode electrode CE in each of the plurality of sub pixel areas PA, and is surrounded by the cathode electrode CE. That is, each of the plurality of connection electrode patterns CEP may be disposed in the anode contact area ACA surrounded by the cathode electrode connection lines CEL2 which are adjacent to the cathode electrode lines CEL1.

Each of the plurality of connection electrode patterns CEP according to one aspect of the present disclosure is provided as an island shape on the planarization layer 120 which is overlapped with the source electrode SE of the driving thin film transistor DT, and is electrically connected with the source electrode SE of the driving thin film transistor DT through an anode contact hole (CH1) prepared in the planarization layer 120. For example, the plurality of connection electrode patterns CEP may be manufactured together with the cathode electrode CE, and may be formed of the same material as that of the cathode electrode CE.

The emission layer EL is disposed on the cathode electrode CE. The emission layer EL according to one aspect of the present disclosure may be a common layer which is formed on the remaining portions except the anode contact area ACA in each of the plurality of sub pixel areas PA. The emission layer EL may include any one among an organic emission layer, an inorganic emission layer, and a quantum dot emission layer, or may include a deposition or mixture structure of an organic emission layer (or inorganic emission layer) and a quantum dot emission layer.

The emission layer EL according to one aspect of the present disclosure may include two or more emission parts for emitting white light. For example, the emission layer EL may include a first emission part and a second emission part for emitting white light by mixing first light and second light together. Herein, the first emission part for emitting the first light may include any one among a blue emission part, a green emission part, a red emission part, a yellow emission part, and a yellowish green emission part. The second emission part for emitting the second light may include an emission part for emitting light whose color is complementary to the color of the first light, which may be selected from the blue emission part, the green emission part, the red emission part, the yellow emission part, and the yellowish green emission part.

Additionally, the emission layer EL may further include at least one functional layer for improving emission efficiency and/or lifespan of the emission layer.

Each of the plurality of anode electrodes AE may be disposed on the emission layer EL in each of the plurality of sub pixel areas PA, and the plurality of anode electrodes AE are connected with the plurality of connection electrode patterns CEP through the anode contact area ACA by one-to-one correspondence. According as the anode electrode AE disposed in each of the plurality of sub pixel areas PA is electrically connected with the source electrode SE of the driving thin film transistor DT through the corresponding connection electrode pattern CEP, the anode electrode AE is supplied with a data signal from the driving thin film transistor DT.

Each of the plurality of anode electrodes AE according to one aspect of the present disclosure may be formed in a single-layered structure or multi-layered structure selected from graphene and transparent conductive materials having a relatively high work function. For example, the transparent conductive material may be a metal oxide such as indium-tin-oxide (ITO) or indium-zinc-oxide (IZO), or a mixture of metal and oxide such as ZnO:Al or SnO2:Sb. Herein, when the light emitting display device according to the present disclosure is embodied in a stretchable display device, each of the plurality of anode electrodes AE may be formed of graphene.

The display panel 100 according to one aspect of the present disclosure may further include at least one cathode power line CPL.

The at least one cathode power line CPL may be disposed along the second direction Y on the substrate 110, and is electrically connected with the cathode electrode CE. The at least one cathode power line CPL according to one aspect of the present disclosure is disposed on the substrate 110 overlapped with at least one among the plurality of cathode electrode lines CEL1 arranged in the plurality of sub pixel areas PA, and is covered by the buffer layer 112. The at least one cathode power line CPL may be electrically connected with at least one among the plurality of cathode electrode lines CEL1 through a cathode contact hole CH2 prepared in the planarization layer 120 and the insulating interlayer 113/buffer layer 112. The at least one cathode power line CPL supplies cathode power, which is provided from the panel driving circuit portion 300 through the pad portion disposed at one edge of the substrate 110, to the cathode electrode CE. The at least one cathode power line CPL according to one aspect of the present disclosure may be formed of molybdenum (Mo), aluminum (Al), chrome (Cr), gold (Au), titanium (Ti), nickel (Ni), neodymium (Nd), copper (Cu), or theirs alloys, wherein the at least one cathode power line CPL may be formed in a single-layered structure of one of the aforementioned metal materials and alloys, or a multi-layered structure of at least two selected from the aforementioned metal materials and alloys.

The display panel 100 according to one aspect of the present disclosure may further include a light shielding layer 111.

The light shielding layer 111 may be disposed between the substrate 110 and the driving thin film transistor DT. That is, the light shielding layer 111 may be disposed between the substrate 110 and the active layer ACT of the driving thin film transistor DT disposed in each of the plurality of sub pixel areas PA. The light shielding layer 111 may block light which is incident on the active layer ACT of the driving thin film transistor DT, to thereby prevent the active layer ACT of the driving thin film transistor DT from being deteriorated by the light. The light shielding layer 111 may be manufactured together with the at least one cathode power line CPL, and may be formed of the same material as that of the at least one cathode power line CPL.

The display panel 100 according to one aspect of the present disclosure may further include at least one cathode connection pattern CCP.

The at least one cathode connection pattern CCP may be disposed on the insulating interlayer 113, and may electrically connect the cathode electrode CE and the at least one cathode power line CPL with each other. The at least one cathode connection pattern CCP according to one aspect of the present disclosure may be disposed on the insulating interlayer 113 which is overlapped with at least one among the plurality of cathode electrode lines CEL1 disposed in the plurality of sub pixel areas PA, may be electrically connected with at least one among the plurality of cathode electrode lines CEL1 through the cathode contact hole CH2 prepared in the planarization layer 120 and the passivation film 114, and may be electrically connected with at least one cathode power line CPL through a cathode connection pattern contact hole CH3 prepared in the insulating interlayer 113. The at least one cathode connection pattern CCP, which is provided in an island shape between the cathode electrode CE and the cathode power line CPL, functions as a middle electrode between the cathode electrode CE and the cathode power line CPL, to thereby prevent an electrical connection failure between the cathode electrode CE and the cathode power line CPL. For example, the at least one cathode connection pattern CCP may be manufactured together with the source electrode SE of the driving thin film transistor DT, and may be formed of the same material as that of the source electrode SE of the driving thin film transistor DT.

The at least one cathode connection pattern CCP may be covered by a passivation film 114 interposed between the planarization layer 120 and the insulating interlayer 113. For example, the passivation film 114 may be formed of the same material as that of the insulating interlayer 113. In another way, the passivation film 114 may be formed of the same material as that of the planarization layer 120. In this case, the passivation film 114 may be expressed as a first planarization layer, and the planarization layer 120 may be expressed as a second planarization layer. Accordingly, the at least one cathode connection pattern CCP may be electrically connected with the cathode electrode CE via the cathode contact hole CH2 prepared through the planarization layer 120 and the passivation film 114.

Selectively, the at least one cathode connection pattern CCP may be changed into the at least one cathode power line CPL. In this case, instead of the at least one cathode connection pattern CCP, the at least one cathode power line CPL is disposed on the insulating interlayer 113 which is overlapped with at least one among the plurality of cathode electrode lines CEL1 disposed in the plurality of sub pixel areas PA, and is electrically connected with at least one among the plurality of cathode electrode lines CEL1 through the cathode contact hole CH2 prepared in the planarization layer 120 and the passivation film 114, whereby the cathode power, which is provided from the panel driving circuit portion 300 through the pad portion disposed at one edge of the substrate 110, may be supplied to the cathode electrode CE. For example, the at least one cathode power line CPL may be manufactured together with the source electrode SE of the driving thin film transistor DT, and may be formed of the same material as that of the source electrode SE of the driving thin film transistor DT, whereby the at least one cathode power line CPL may be covered by the passivation film 114. Accordingly, the at least one cathode power line CPL may be electrically connected with the cathode electrode CE via the cathode contact hole CH2 prepared through the planarization layer 120 and the passivation film 114.

The display panel 110 according to one aspect of the present disclosure may further include a bank layer 130.

The bank layer 130 may include a plurality of opening portions 131 which are disposed on the planarization layer 120 and are overlapped with the respective emission areas EA in the plurality of sub pixel areas PA, and a plurality of electrode exposing portions 133 which are overlapped with the respective anode contact areas ACA in the plurality of sub pixel areas PA.

The bank layer 130 according to one aspect of the present disclosure is disposed between each of the plurality of sub pixel areas PA, to thereby define the emission area EA and the anode contact area ACA in each of the plurality of sub pixel areas PA. Also, the bank layer 130 electrically separates the connection electrode pattern CEP and the cathode electrode CE disposed in each of the plurality of sub pixel areas PA from each other. For example, the bank layer 130 may be disposed on the planarization layer 120 and the remaining portions of the cathode electrode CE except the portion overlapped with the emission area EA and the portion overlapped with the anode contact area ACA in the entire portions of the cathode electrode CE disposed in each of the plurality of sub pixel areas PA.

Each of the plurality of opening portions 131 may be prepared by patterning (or removing) the bank layer 130 formed on the cathode electrode CE which is overlapped with each emission area EA in each of the plurality of sub pixel areas PA, to thereby expose the cathode electrode line CEL1 of the cathode electrode CE.

Each of the plurality of electrode exposing portions 133 may be prepared by patterning (or removing) the bank layer 130 formed on the connection electrode pattern CEP overlapped with the anode contact area ACA in each of the plurality of sub pixel areas PA, to thereby expose some portions of the connection electrode pattern CEP. Accordingly, one side portion in each of the plurality of anode electrodes AE may be connected with each of the plurality of connection electrode patterns CEP through each of the plurality of electrode exposing portions 133 by one-to-one correspondence, wherein one side portion in each of the plurality of anode electrodes AE may be electrically connected with the source electrode SE of the corresponding driving thin film transistor DT through the corresponding connection electrode pattern CEP.

The bank layer 130 according to one aspect of the present disclosure may be formed of an opaque material including black pigment such as carbon black, for example, may be formed in an organic film of polyimides resin, acryl resin, benzocyclobutene (BCB), and etc., but not limited to these materials. The bank layer 130 according to another aspect of the present disclosure may be formed of a transparent material, for example, acryl resin, epoxy resin, phenolic resin, polyamide resin, or polyimide resin, but not limited to these materials.

The display panel 100 according to one aspect of the present disclosure may further include a partition 140.

The partition 140 may be disposed on the bank layer 130 overlapped with each of the plurality of connection electrode patterns CEP, whereby the partition 140 covers each of the plurality of electrode exposing portions 133, to thereby separate each of the plurality of anode electrodes AE from each other.

The partition 140 according to one aspect of the present disclosure may be disposed in a reverse-tapered structure on the boundary area between the bank layer 130 and the electrode exposing portion 133 disposed on the anode contact area ACA. For example, the partition 140 may include a lower surface having a first width on the boundary area between the bank layer 130 and the electrode exposing portion 133, an upper surface having a second width which is larger than the first width, and is identical to or larger than a width of the electrode exposing portion 133, and an inclined surface disposed between the lower surface and the upper surface and configured to cover the electrode exposing portion 133. The upper surface of the partition 140 has the second width which is identical to or larger than the width of the electrode exposing portion 133 on the plane, to thereby cover the electrode exposing portion 133. Accordingly, an infiltration space (IS, or pore) is prepared between the inclined surface of the partition 140 and the connection electrode pattern CEP exposed to the electrode exposing portion 133, and one edge of the anode electrode AE is electrically connected with the connection electrode pattern CEP exposed to the electrode exposing portion 133 through the infiltration space IS.

The partition 140 according to one aspect of the present disclosure covers the electrode exposing portion 133 so that it is possible to prevent the emission layer EL deposited on the cathode electrode CE and the bank layer 130 by a deposition process of the emission layer after a process of manufacturing the bank layer 130 from infiltrating into the electrode exposing portion 133, and being deposited on the connection electrode pattern CEP exposed to the electrode exposing portion 133. That is, the emission layer EL may be deposited by an evaporation deposition process. In this case, an evaporation material of the emission layer has strong straightness so that the evaporation material does not infiltrate into the electrode exposing portion 133 covered by the partition 140, whereby the evaporation material is not deposited on the connection electrode pattern CEP exposed to the electrode exposing portion 133. Herein, when the connection electrode pattern CEP exposed to the electrode exposing portion 133 is not covered by the partition 140, the emission layer EL may be deposited on the connection electrode pattern CEP exposed to the electrode exposing portion 133 so that it is impossible to provide an electrical connection between the anode electrode AE and the connection electrode pattern CEP. In this reason, the width of the upper surface of the partition 140 may be larger than the width of the electrode exposing portion 133 on the plane. Meanwhile, the anode electrode AE may be formed by a deposition process such as sputtering process capable of realizing good step coverage. In this case, a sputtering anode electrode material may be deposited on the emission layer EL disposed on the cathode electrode CE and the bank layer 130, and may be formed on the connection electrode pattern CEP through the infiltration into the connection electrode pattern CEP exposed to the electrode exposing portion 133 via the infiltration space IS.

The partition 140 according to one aspect of the present disclosure electrically separates the anode electrodes AE adjacently disposed on the electrode exposing portion 133 from each other. That is, while the edges of the anode electrodes AE disposed in the adjacent two sub pixel areas PA are overlapped with each other on the electrode exposing portion 133 under the circumstances that the partition 140 may be interposed in-between, the edges of the anode electrodes AE disposed in the adjacent two sub pixel areas PA are separated in an up-and-down direction by the partition 140, whereby the anode electrodes AE disposed in the adjacent two sub pixel areas PA are electrically separated from each other. Thus, the partition 140 electrically separates the plurality of anode electrodes AE disposed in the plurality of sub pixel areas PA from each other, whereby each of the plurality of anode electrodes AE may be disposed in an island shape on each of the plurality of sub pixel areas PA. According as each of the plurality of anode electrodes AE disposed in each of the plurality of sub pixel areas PA may be electrically connected with the source electrode SE of the corresponding driving thin film transistor DT through the corresponding connection electrode pattern CEP, each of the plurality of anode electrodes AE may be individually supplied with the corresponding data signal from the corresponding driving thin film transistor DT.

The display panel 100 according to one aspect of the present disclosure may further include an encapsulation substrate 190.

The encapsulation substrate 190 may confront the substrate 110. The encapsulation substrate 190 according to one aspect of the present disclosure may be a flexible substrate or plastic film. For example, the encapsulation substrate 190 may be a polyethylene terephthalate film or a transparent polyimide film. The encapsulation substrate 190 may be bonded to the substrate 110 by the use of adhesive layer 150. The adhesive layer 150 may be optically clear adhesive (OCA), optically clear resin (OCR), or pressure sensitive adhesive (PSA), and the adhesive layer 150 may further include a moisture-absorbing material for a moisture-absorbing function.

The encapsulation substrate 190 according to one aspect of the present disclosure may include a black matrix 191 and a color filter 193.

The black matrix 191 defines a plurality of transmission portions respectively overlapped with the plurality of emission areas EA defined on the substrate 110. The black matrix 191 according to one aspect of the present disclosure may be formed of an opaque metal material or resin material such as chrome (Cr or CrOx), or may be formed of a light-absorbing material.

The color filter 193 may be disposed in each of the plurality of transmission portions prepared by the black matrix 191. The color filter 193 according to one aspect of the present disclosure may include any one color filter among a red color filter, a green color filter, and a blue color filter. The red color filter, the green color filter, and the blue color filter may be repeatedly arranged along the first direction X.

Selectively, the color filter 193 may include a quantum dot having a size for emitting light of a preset color by a re-emission in accordance with an incident light emitted from the emission layer EL. Herein, the quantum dot may be formed of one of CdS, CdSe, CdTe, CdZnSeS, ZnS, ZnSe, GaAs, GaP, GaAs—P, Ga—Sb, InAs, InP, InSb, AlAs, AlP, and AlSb. For example, the red color filter may include the quantum dot of CdSe or InP, the green color filter may include the quantum dot of CdZnSeS, and the blue color filter may include the quantum dot of ZnSe. When the color filter 193 includes the quantum dot, it is possible to realize great color resolution.

The encapsulation substrate 190 according to one aspect of the present disclosure may further include a barrier layer. The barrier layer may be disposed on one entire surface of the encapsulation substrate 190 confronting the substrate 110, to thereby prevent a permeation of external water or moisture. The barrier layer according to one aspect of the present disclosure may include at least one inorganic layer of an inorganic material. For example, the barrier layer may include any one inorganic material such as a silicon oxide film (SiOx), a silicon nitride film (SiNx), a silicon oxide nitride film (SiON), a titanium oxide film (TiOx), and an aluminum oxide film (AlOx).

When the encapsulation substrate 190 may include the barrier layer, the black matrix 191 and the color filter 193 may be disposed on the barrier layer.

The display panel 100 according to one aspect of the present disclosure may further include a transmissive film attached to the other surface (or display surface) of the encapsulation substrate 190. The transmissive film may be attached to the other surface of the encapsulation substrate 190 by the use of transparent adhesive layer, thereby protecting the display surface of the display panel 100, and improving a front surface hardness of the display panel 100. The transmissive film according to one aspect of the present disclosure may be at least one film selected from a polyethylene terephthalate film, a reflection preventing film, a polarizing film, and a transmittance controllable film. The transparent adhesive layer may be optically clear adhesive (OCA), optically clear resin (OCR), or pressure sensitive adhesive (PSA).

The display panel 100 according to one aspect of the present disclosure may further include a gate driving embedded circuit 200.

The gate driving embedded circuit 200 supplies gate signals to the gate lines in accordance with a gate control signal provided from the panel driving circuit portion 300. The gate driving embedded circuit 200 according to one aspect of the present disclosure together with the driving thin film transistor DT may be disposed in the non-display area NDA of the substrate 110. For example, the gate driving embedded circuit 200 may be disposed in at least one non-display area NDA of both opposite non-display areas NDA of the substrate 110. The gate driving embedded circuit 200 according to another aspect of the present disclosure may be embodied in an integrated circuit. In this case, the gate driving embedded circuit 200 may be mounted on the substrate 110 and connected with the gate lines, or may be mounted on the flexible circuit film and connected with the gate lines through the gate pad portion of the substrate 110.

The panel driving circuit portion 300 may be connected with the pad portion disposed at one edge of the substrate 110, and the panel driving circuit portion 300 displays an image corresponding to video data supplied from a display driving system on each sub pixel. The panel driving circuit portion 300 according to one aspect of the present disclosure may include a plurality of flexible circuit films 310, a plurality of data driving integrated circuits 330, a printed circuit board 350, a timing controller 370, and a power supply circuit 390.

Each of the plurality of flexible circuit films 310 may be attached to each pad portion prepared in the printed circuit board 350 and the substrate 110 of the display panel 100 by a film attachment process using an anisotropic conductive film.

Each of the plurality of data driving integrated circuits 330 may be individually mounted on the plurality of flexible circuit films 310. Each of the plurality of data driving integrated circuit 330 receives pixel data and a data control signal from the timing controller 370, converts the pixel data into an analog type pixel data signal in accordance with the data control signal, and supplies the analog type pixel data signal to the corresponding data line.

The printed circuit board 350 supports the timing controller 370, and the printed circuit board 350 serves as a transmitter of signals and power among elements included in the panel driving circuit portion 300.

The timing controller 370 may be mounted on the printed circuit board 350, and the timing controller 370 receives video data and a timing synchronization signal from the display driving system through a user connector prepared in the printed circuit board 350. The timing controller 370 may generate pixel data by aligning the video data to be appropriate for a pixel arrangement structure of the display area DA in accordance with the timing synchronization signal, and may provide the generated pixel data to the corresponding data driving integrated circuit 330. Also, the timing controller 370 may generate the data control signal and the gate control signal on the basis of the timing synchronization signal, may control driving timing for each of the plurality of data driving integrated circuits 330 through the use of data control signal, and may control driving timing for each of the plurality of gate driving embedded circuits 200 through the use of gate control signal. In this case, a scan control signal may be supplied to the gate driving embedded circuit 200 through the first and/or last flexible circuit films among the plurality of flexible circuit films 310 and the non-display area NDA of the substrate 110.

The power supply circuit 390 may be mounted on the printed circuit board 350, and the power supply circuit 390 may generate various voltages needed for displaying an image on the display panel 100 by the use of externally-provided power, and provides the generated various voltages to the corresponding circuit. Especially, the power supply circuit 390 may generate cathode power, and may supply the generated cathode power to at least one cathode power line or cathode electrode CE disposed in the display panel 100 through at least one among the plurality of flexible circuit films 310 and the printed circuit board 350.

According to one aspect of the present disclosure, the cathode electrode CE, which is formed of the metal material having great reflection efficiency, may be disposed adjacent to the substrate 110, and the plurality of transparent anode electrodes AE may be disposed on the emission layer EL, and may be connected with the driving thin film transistor DT through the connection electrode pattern CEP so that it is possible to prevent non-uniformity of luminance caused by the voltage drop (IR drop) of the cathode voltage supplied to the cathode electrode CE, and to control a current flowing to the emission layer EL disposed in each of the plurality of sub pixel areas by the individual control of the data signal applied to each of the plurality of anode electrodes AE. According to one aspect of the present disclosure, the cathode electrode CE, which is less sensitive to moisture and oxygen in comparison to the transparent anode electrode AE, is disposed adjacent to the substrate 110, to thereby minimize a deterioration of the emission layer EL caused by the moisture and oxygen.

Figure 5:
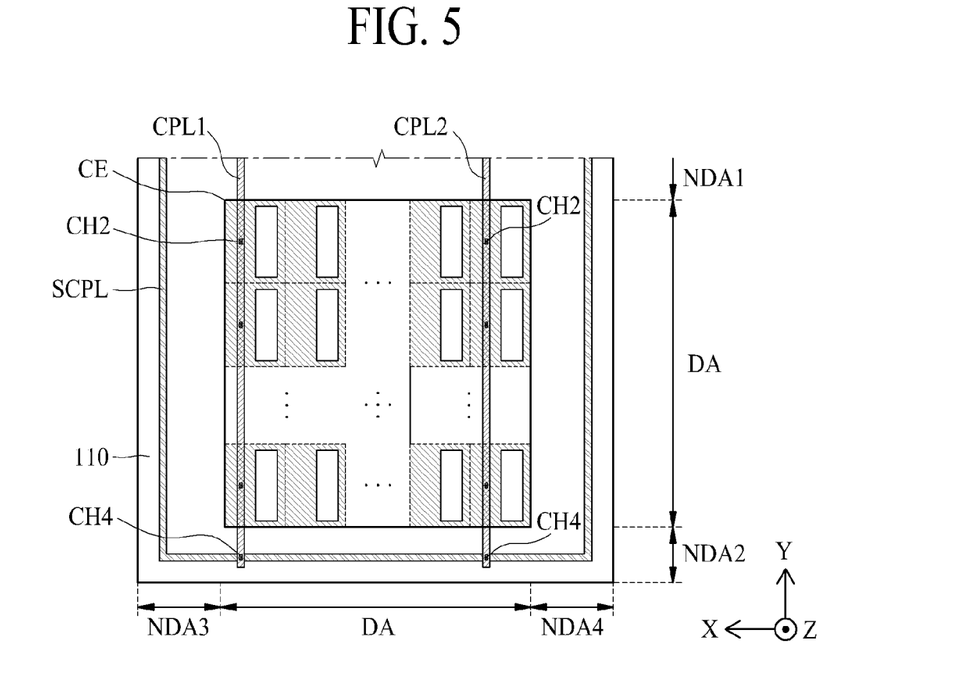
FIG. 5 illustrates a supply structure of a cathode power according to another aspect in the light emitting display device according to one aspect of the present disclosure.

FIG. 5 illustrates a cathode power supply structure according to another aspect in the light emitting display device according to one aspect of the present disclosure, which shows only cathode electrode and cathode power line.

Referring to FIG. 5 in connection with FIGS. 1 and 2, a display panel 100 of the display device according to one aspect of the present disclosure may further include a supplementary cathode power line SCPL arranged along the remaining edges (or second to fourth non-display areas) NDA2, NDA3 and NDA4 except for one edge (or first non-display area) NDA1 of a substrate 110.

The supplementary cathode power line SCPL may be disposed in the second to fourth non-display areas NDA2, NDA3 and NDA4 of the substrate 110 to surround second to fourth sides except a first side of a display area DA adjacent to one edge NDA1 of the substrate 110. In this case, one side of the supplementary cathode power line SCPL may be electrically connected with a supplementary cathode power pad of a first pad portion disposed in the first non-display area NDA1, and the other side of the supplementary cathode power line SCPL may be electrically connected with a supplementary cathode power pad of a final pad portion disposed in the first non-display area NDA1. The supplementary cathode power line SCPL may be supplied with cathode power from a power supply circuit 390 of a panel driving circuit portion 300 through the supplementary cathode power pad of the pad portion.

The supplementary cathode power line SCPL according to one aspect of the present disclosure may be manufactured together with a light shielding layer 111, and may be formed of the same material as that of the light shielding layer 111, but not necessarily. The supplementary cathode power line SCPL may be manufactured together with a gate electrode GE or source electrode SE of a driving thin film transistor DT, and may be formed of the same material as that of the gate electrode GE or source electrode SE of the driving thin film transistor DT within a range capable of being electrically separated from other lines disposed on the substrate 110.

A cathode electrode CE according to this aspect of the present disclosure may be electrically connected with at least one cathode power line CPL1 and CPL2 through a cathode contact hole CH2 and a cathode connection pattern contact hole CH3. Herein, one side of the at least one cathode power line CPL1 and CPL2 may be electrically connected with a cathode power pad of a pad portion arranged at one edge of the substrate 110. The cathode power pad may be supplied with cathode power from the power supply circuit 390 of the panel driving circuit portion 300.

The display device according to one aspect of the present disclosure may further include first and second cathode power lines CPL1 and CPL2.

The first cathode power line CPL1 may be arranged in the second direction Y while being overlapped with the cathode electrode CE disposed in the first pixel column, and may be electrically connected with the cathode electrode CE disposed in at least one among a plurality of sub pixel areas included in the first pixel column through a plurality of cathode contact holes CH2. The first cathode power line CPL1 according to one aspect of the present disclosure may be manufactured together with the gate electrode GE or source electrode SE of the driving thin film transistor DT, and may be formed of the same material as that of the gate electrode GE or source electrode SE of the driving thin film transistor DT.

Herein, one side of the first cathode power line CPL1 may be electrically connected with the cathode power pad of the pad portion disposed at one edge of the substrate 110, and the other side of the first cathode power line CPL1 may be electrically connected with the supplementary cathode power line SCPL disposed in the second non-display area NDA2 of the substrate 110 through a line contact hole CH4.

The second cathode power line CPL2 may be arranged in the second direction Y while being overlapped with the cathode electrode CE disposed in the last pixel column, and may be electrically connected with the cathode electrode CE disposed in at least one among a plurality of sub pixel areas included in the last pixel column through a plurality of cathode contact holes CH2. The second cathode power line CPL2 according to one aspect of the present disclosure may be formed in the same layer as the first cathode power line CPL1.

Herein, one side of the second cathode power line CPL2 may be electrically connected with the cathode power pad of the pad portion disposed at one edge of the substrate 110, and the other side of the second cathode power line CPL2 may be electrically connected with the supplementary cathode power line SCPL disposed in the second non-display area NDA2 of the substrate 110 through a line contact hole CH4.

In the display device according to one aspect of the present disclosure, the cathode power line may be disposed along the second direction Y while being overlapped with the cathode electrode CE arranged in the pixel column, wherein one side of the cathode power line is electrically connected with the cathode power pad, and the other side of the cathode power line may be electrically connected with the supplementary cathode power line SCPL. In this case, the cathode power may be uniformly supplied to the entire surface of the cathode electrode CE disposed as a single electrode on the substrate 110.

In the display device according to the aspect of the present disclosure, the cathode power may be supplied to the left, right, lower, and upper sides of the cathode electrode CE disposed as the single electrode type through the supplementary cathode power line SCPL and the cathode power line CPL1 and CPL2 so that it is possible to prevent non-uniformity of luminance caused by the voltage drop (IR drop) of the cathode voltage.

Figure 6:
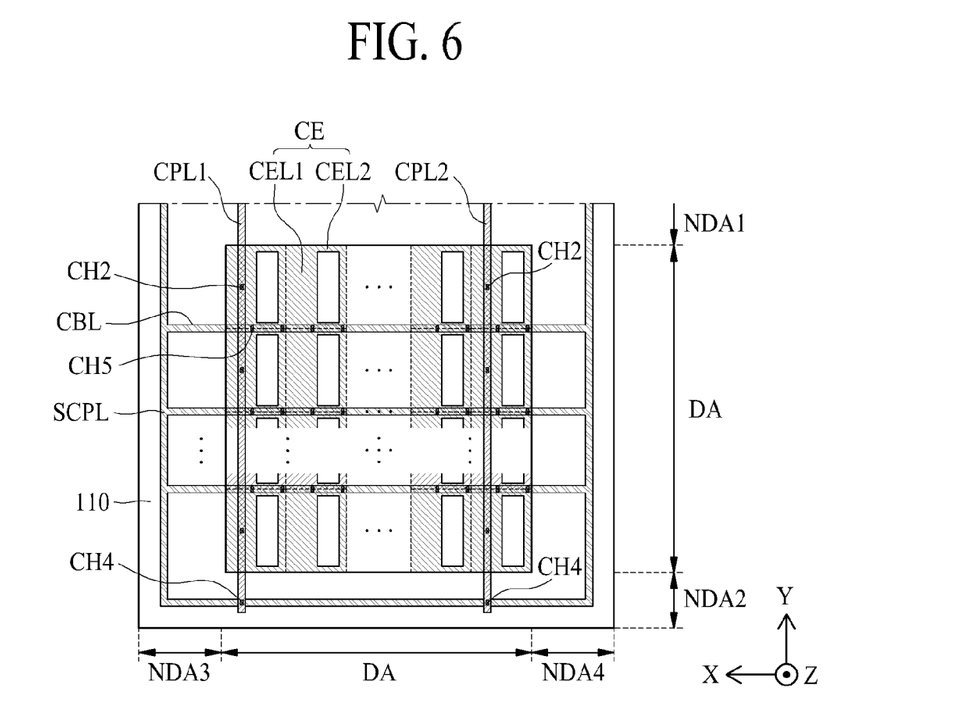
FIG. 6 illustrates a supply structure of a cathode power according to another aspect in the light emitting display device according to one aspect of the present disclosure.

FIG. 6 illustrates a cathode power supply structure according to another aspect in the light emitting display device according to one aspect of the present disclosure, which shows only cathode electrode and cathode power line.

Referring to FIG. 6 in connection with FIGS. 1 and 2, a display panel 100 of the display device according to one aspect of the present disclosure may further include a plurality of cathode bridge lines CBL.

The plurality of cathode bridge lines CBL may be arranged along the first direction X on the substrate 110 while being overlapped with a plurality of cathode electrode connection lines CEL2 arranged along the first direction X. The plurality of cathode bridge lines CBL may be electrically connected with a plurality of cathode electrode lines CEL1 through a plurality of bridge contact holes CH5 under the circumstances that the cathode electrode connection line CEL2 may be provided between each of the plurality of cathode bridge lines CBL. Thus, the two cathode electrodes lines CEL1 adjacent to each other along the first direction X are double-connected through the cathode electrode connection line CEL2 and the cathode bridge line CBL. The plurality of cathode bridge lines CBL may divert the cathode power supplied to the cathode electrode line CEL1 of the cathode electrode CE disposed in each of the first pixel column and the final pixel column through the cathode power line CPL1 and CPL2, and additionally supply the cathode power to the next cathode electrode line CEL1 adjacent in the first direction X so that it is possible to prevent a current bottleneck phenomenon occurring in each of the plurality of cathode electrode connection lines CEL2 having the relatively smaller size in comparison to the plurality of cathode electrode lines CEL1, and to make the current uniformly flowing in the cathode electrode CE by the smooth current flow inside the cathode electrode CE.

Additionally, both ends in each of the plurality of cathode bridge lines CBL respectively extend to the third non-display area NDA3 and the fourth non-display area NDA4 of the substrate 110, and may be then electrically connected with the supplementary cathode power line SCPL. In this case, the cathode power supplied to the supplementary cathode power line SCPL may be additionally supplied to each of the plurality of cathode bridge lines CBL so that it enables the smooth current flow inside the cathode electrode CE, thereby realizing the more uniform current flow in the cathode electrode CE.

In the display device according to the aspect of the present disclosure, the uniform cathode power may be supplied to the cathode electrode CE disposed in the single electrode type through the supplementary cathode power line SCPL, the cathode power line CPL1 and CPL2, and the plurality of cathode bridge lines CBL so that it is possible to prevent non-uniformity of luminance caused by the voltage drop (IR drop) of the cathode voltage.

Accordingly, the light emitting display device according to the present disclosure may be described as follows.

The light emitting display device according to one aspect of the present disclosure may include a substrate including a plurality of sub pixel areas having an emission area and an anode contact area adjacent to the emission area, a driving thin film transistor disposed in each of the plurality of sub pixel areas, a planarization layer disposed on the substrate and configured to cover the driving thin film transistor disposed in each of the plurality of sub pixel areas, a cathode electrode disposed on the planarization layer overlapped with the emission area in each of the plurality of sub pixel areas, a plurality of connection electrode patterns disposed on the planarization layer overlapped with the anode contact area in each of the plurality of sub pixel areas, and connected with respective source electrodes of the driving thin film transistors disposed in the plurality of sub pixel areas by one-to-one correspondence, an emission layer disposed on the cathode electrode, and a plurality of anode electrodes disposed on the emission layer in each of the plurality of sub pixel areas, and connected with the plurality of connection electrode patterns through the anode contact area by one-to-one correspondence.

According to one aspect of the present disclosure, the connection electrode pattern is formed of the same material as that of the cathode electrode, and is surrounded by the cathode electrode.

According to one aspect of the present disclosure, the cathode electrode includes a plurality of cathode electrode lines disposed on the respective emission areas in the plurality of sub pixel areas, provided at fixed intervals along a first direction, and configured to extend in a second direction which is perpendicular to the first direction, and a plurality of cathode electrode connection lines disposed between each of the plurality of connection electrode patterns disposed along the second direction, and configured to electrically connect the two cathode electrode lines adjacent to each other along the first direction with each other.

The light emitting display device according to one aspect of the present disclosure may further include at least one cathode power line disposed on the substrate along the second direction and electrically connected with at least one among the plurality of cathode electrode lines. At this time, the at least one cathode power line is formed of the same material as that of a source electrode of the driving thin film transistor.

The light emitting display device according to one aspect of the present disclosure may further include a light shielding layer disposed between the substrate and the driving thin film transistor, wherein the light shielding layer is formed of the same material as that of the at least one cathode power line.

The light emitting display device according to one aspect of the present disclosure may further include a cathode connection pattern disposed on the insulating interlayer and configured to electrically connect the cathode electrode and the at least one cathode power line with each other, wherein the cathode connection pattern is formed of the same material as that of a source electrode of the driving thin film transistor.

The light emitting display device according to one aspect of the present disclosure may further include a pad portion disposed at one edge of the substrate, wherein one side of the at least one cathode power line is electrically connected with the pad portion.

The light emitting display device according to one aspect of the present disclosure may further include a supplementary cathode power line disposed along the remaining edges except one edge of the substrate and connected with the pad portion, wherein the other side of the at least one cathode power line is electrically connected with the supplementary cathode power line.

The light emitting display device according to one aspect of the present disclosure may further include a plurality of cathode bridge lines disposed on the substrate along the first direction while being overlapped with the plurality of cathode electrode connection lines disposed along the first direction.

The light emitting display device according to one aspect of the present disclosure may further include a supplementary cathode power line disposed along the remaining edges except one edge of the substrate and connected with the pad portion, wherein both ends in each of the plurality of cathode bridge lines are electrically connected with the supplementary cathode power line.

The light emitting display device according to one aspect of the present disclosure may further include a bank layer disposed on the planarization layer, and configured to include a plurality of opening portions overlapped with the respective emission areas in the plurality of sub pixel areas, and a plurality of electrode exposing portions overlapped with the respective anode contact areas in the plurality of sub pixel areas, wherein the plurality of anode electrodes are connected with the plurality of connection electrode patterns through the plurality of electrode exposing portions by one-to-one correspondence.

The light emitting display device according to one aspect of the present disclosure may further include a partition disposed on the bank layer overlapped with each of the plurality of connection electrode patterns, and configured to cover each of the plurality of electrode exposing portions, wherein one edge in each of the plurality of anode electrodes is electrically connected with the connection electrode pattern via a space disposed in the electrode exposing portion between the partition and the connection electrode pattern.

Accordingly, the light emitting display device according to the present disclosure may prevent non-uniformity of luminance caused by the voltage drop (IR drop) of the cathode voltage supplied to the cathode electrode.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A light emitting display device comprising:
a substrate including a plurality of sub pixel areas each, wherein the plurality of sub pixel areas having an emission area and an anode contact area adjacent to the emission area;
a driving thin film transistor disposed in each sub pixel area, wherein the driving thin film transistor having a source electrode;
a planarization layer disposed on the substrate and covering the driving thin film transistor;
a cathode electrode disposed on the planarization layer and overlapping the emission area in each sub pixel area;
a plurality of connection electrode patterns disposed on the planarization layer, overlapping the anode contact area in each sub pixel area and respectively connected with the source electrode of the driving thin film transistor as one-to-one correspondence;
an emission layer disposed on the cathode electrode; and
a plurality of anode electrodes disposed on the emission layer in each sub pixel area and connected with the plurality of connection electrode patterns at the anode contact area as one-to-one correspondence,
wherein the cathode electrode includes:
a plurality of cathode electrode lines respectively disposed on the emission areas in each sub pixel area, provided at fixed intervals along a first direction, and extended in a second direction perpendicular to the first direction; and
a plurality of cathode electrode connection lines disposed between each of the plurality of connection electrode patterns which is disposed along the second direction, and electrically connecting two cathode electrode lines of the plurality of cathode electrode lines adjacent to each other along the first direction with each other,
wherein the light emitting display device further comprises at least one cathode power line disposed on the substrate along the second direction and electrically connected with at least one cathode electrode lines among the plurality of cathode electrode lines.

2. The light emitting display device according to claim 1, wherein the plurality of connection electrode patterns are formed of a same material as the cathode electrode and wherein each of the connection electrode patterns are surrounded by the cathode electrode.

3. The light emitting display device according to claim 1, wherein the at least one cathode power line is formed of a same material as the source electrode of the driving thin film transistor.

4. The light emitting display device according to claim 1, further comprising a light shielding layer disposed between the substrate and the driving thin film transistor,
wherein the light shielding layer is formed of a same material as the at least one cathode power line.

5. The light emitting display device according to claim 4, further comprising a cathode connection pattern disposed on the planarization layer and electrically connecting the cathode electrode and the at least one cathode power line,
wherein the cathode connection pattern is formed of a same material as the source electrode of the driving thin film transistor.

6. The light emitting display device according to claim 1, further comprising a pad portion disposed at one edge of the substrate,
wherein one side of the at least one cathode power line is electrically connected with the pad portion.

7. The light emitting display device according to claim 6, further comprising a supplementary cathode power line disposed along remaining edges except for the one edge of the substrate and connected with the pad portion,
wherein the other side of the at least one cathode power line is electrically connected with the supplementary cathode power line.

8. The light emitting display device according to claim 7, further comprising a plurality of cathode bridge lines disposed on the substrate along the first direction and overlapping the plurality of cathode electrode connection lines disposed along the first direction.

9. The light emitting display device according to claim 8, further comprising a supplementary cathode power line disposed along the remaining edges except for the one edge of the substrate and connected with the pad portion,
wherein both ends of each of the plurality of cathode bridge lines are electrically connected with the supplementary cathode power line.

10. The light emitting display device according to claim 1, further comprising a bank layer disposed on the planarization layer, and including a plurality of opening portions overlapping the emission in each sub pixel area, and a plurality of electrode exposing portions respectively overlapping the anode contact area in each sub pixel area,
wherein the plurality of anode electrodes are connected with the plurality of connection electrode patterns through the plurality of electrode exposing portions as one-to-one correspondence.

11. The light emitting display device according to claim 10, further comprising a partition disposed on the bank layer overlapping each of the plurality of connection electrode patterns, and covering each of the plurality of electrode exposing portions,
wherein one edge in each of the plurality of anode electrodes is electrically connected with the plurality of connection electrode pattern via a space disposed in the plurality of electrode exposing portion between the partition and each of the plurality of connection electrode patterns.

12. The light emitting display device according to claim 11, wherein the plurality of anode electrodes are separated from each other by the partition.

13. The light emitting display device according to claim 1, wherein the cathode electrode has at least one of a Ti/Al/Ti deposition structure of aluminum (Al) and titanium (Ti), a ITO/Al/ITO deposition structure of aluminum (Al) and ITO, APC (Ag—Pd—Cu) alloy, and a ITO/APC/ITO deposition structure of APC alloy and ITO.

14. The light emitting display device according to claim 13, wherein the plurality of anode electrodes is formed of graphene or transparent conductive materials.

15. The light emitting display device according to claim 1, wherein the cathode electrode includes one of silver (Ag), aluminum (Al), molybdenum (Mo), gold (Au), magnesium (Mg), calcium (Ca), barium (B a), and metal nano wire.

16. A light emitting display device including a plurality of sub pixel areas, wherein the plurality of sub pixel areas each having an emission area and an anode contact area adjacent to each other, comprising:

a plurality of driving thin film transistors, wherein each of the plurality of driving thin film transistors respectively disposed in the plurality of sub pixel areas;

a substrate supporting the plurality of driving thin film transistors;

a plurality of connection electrode patterns overlapping the anode contact area in each sub pixel area and respectively connected with source electrodes of the driving thin film transistors as one-to-one correspondence;

a cathode electrode overlapping the emission area in each sub pixel area and including a plurality of cathode electrode lines disposed at the emission area and a plurality of cathode electrode connection lines disposed between each of the plurality of connection electrode patterns and electrically connecting two cathode electrode lines of the plurality of cathode electrode lines adjacent to each other;

an emission layer disposed on the cathode electrode;

a plurality of anode electrodes disposed on the emission layer in each sub pixel area and connected with the plurality of connection electrode patterns at the anode contact area as one-to-one correspondence; and at least one cathode power line disposed on the substrate, wherein the at least one cathode power line is electrically connected with at least one of the plurality of cathode electrode lines.

17. The light emitting display device according to claim 16, wherein the plurality of connection electrode patterns is formed of a same material as the cathode electrode and wherein each of the plurality of connection electrode patterns is surrounded by the cathode electrode.

18. A light emitting display device comprising:
a substrate including a plurality of sub pixel areas;
a driving thin film transistor disposed in each of the plurality of sub pixel areas wherein the driving thin film transistor having a source electrode;
a planarization layer disposed on the substrate and configured to cover the driving thin film transistor;
a cathode electrode and a plurality of connection electrode patterns disposed on the planarization layer, wherein the plurality of connection electrode patterns being respectively connected with source electrode of the driving thin film transistor disposed in the plurality of sub pixel areas by one-to-one correspondence;
an emission layer disposed on the cathode electrode; and
a plurality of anode electrodes disposed on the emission layer,
wherein the plurality of connection electrode patterns are electrically separated from the cathode electrode via a bank layer.

19. The light emitting display device according to claim 18, wherein the bank layer is disposed between each of the plurality of sub pixel areas to define an emission area and an anode contact area, and
wherein the cathode electrode is disposed on the planarization layer overlapped with the emission area, and the plurality of connection electrode patterns are disposed on the planarization layer overlapped with the anode contact area.

20. The light emitting display device according to claim 19, wherein the bank layer is configured to include a plurality of opening portions respectively overlapped with the emission area, and a plurality of electrode exposing portions respectively overlapped with the anode contact area,
wherein the plurality of anode electrodes are connected with the plurality of connection electrode patterns through the plurality of electrode exposing portions by one-to-one correspondence.

21. The light emitting display device according to claim 19, wherein the cathode electrode includes:
a plurality of cathode electrode lines respectively disposed on the emission area, provided at fixed intervals along a first direction, and configured to extend in a second direction which is perpendicular to the first direction; and
a plurality of cathode electrode connection lines disposed between each of the plurality of connection electrode patterns disposed along the second direction, and configured to electrically connect the two cathode electrode lines of the plurality of cathode electrode lines adjacent to each other along the first direction with each other.

22. The light emitting display device according to claim 21, further comprising at least one cathode power line disposed on the substrate along the second direction and electrically connected with at least one among the plurality of cathode electrode lines.

23. The light emitting display device according to claim 22, wherein one side of the cathode power line is electrically connected to a cathode power pad, and the other side of the cathode power line is electrically connected with a supplementary cathode power line disposed on a non-display area of the substrate.

24. The light emitting display device according to claim 23, further comprising a plurality of cathode bridge lines disposed on the substrate along the first direction while being overlapped with the plurality of cathode electrode connection lines disposed along the first direction.

25. The light emitting display device according to claim 24, wherein both ends in each of the plurality of cathode bridge lines are electrically connected with the supplementary cathode power line.

* * * * *